United States Patent [19]

Yasuda

[11] 4,362,942

[45] Dec. 7, 1982

[54] ELECTRON BEAM EXPOSURE SYSTEM AND AN APPARATUS FOR CARRYING OUT THE SAME

[75] Inventor: Hiroshi Yasuda, Yokohama, Japan

[73] Assignee: Fujitsu Limited, Kawasaki, Japan

[21] Appl. No.: 213,681

[22] Filed: Dec. 5, 1980

[51] Int. Cl.³ ..................... H01J 37/00; H01J 3/26
[52] U.S. Cl. ............................. 250/398; 250/492.2
[58] Field of Search ......... 250/492.2, 396 R, 396 ML, 250/311, 398

[56] References Cited

U.S. PATENT DOCUMENTS

| | | | |
|---|---|---|---|
| 3,699,304 | 10/1972 | Baldwin et al. | 250/492.2 |
| 3,753,034 | 8/1973 | Spicer | 250/396 |
| 3,922,546 | 11/1975 | Livesay | 250/398 |
| 4,075,488 | 2/1978 | Okayama et al. | 250/492.2 |
| 4,180,738 | 12/1979 | Smith et al. | 250/311 |

Primary Examiner—Bruce C. Anderson
Attorney, Agent, or Firm—Staas & Halsey

[57] ABSTRACT

An electron beam exposure system for projecting an electron beam onto a medium placed on a continuously moving stage, comprises a correction memory storing correction data for at least one of a field curvature, an astigmatism, and a distortion which changes in accordance with a deflection amount of the electron beam. An amount of actual deflection of the electron beam is obtained from the difference between a position data of the medium and the beam deflection position data with the electron beam then being controlled by the corresponding correction data read from the correction memory according to the amount of beam deflection.

23 Claims, 18 Drawing Figures

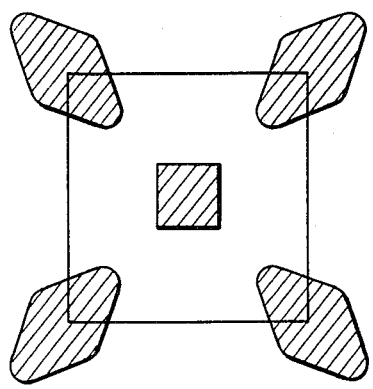
FIG. 6C.
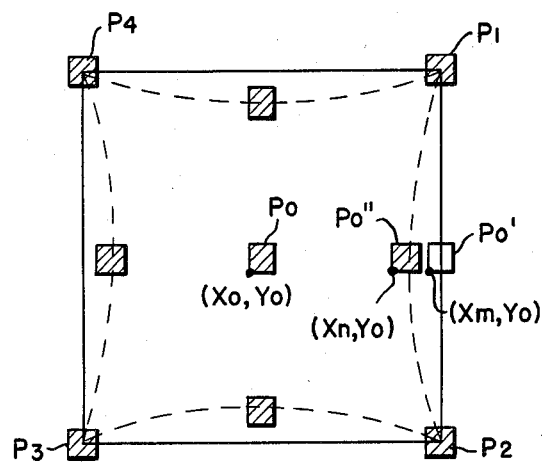
FIG. 6D.
FIG. 7.
| ADDRESS | | FIELD CURVATURE | ASTIGMATISM | | DISTORTION | |
|---|---|---|---|---|---|---|
| X | Y | | X | Y | X | Y |
| ax1 | ay1 | f1 | Sx1 | Sy1 | dx1 | dy1 |
| ax1 | ay2 | f2 | Sx2 | Sy2 | dx2 | dy2 |
| ax1 | ay3 | f3 | Sx3 | Sy3 | dx3 | dy3 |
| ⋮ | ⋮ | ⋮ | ⋮ | ⋮ | ⋮ | ⋮ |
| ax1 | ayi | fi | Sxi | Syi | dxi | dyi |
| ax2 | ayi | fi+1 | Sxi+1 | Syi+1 | dxi+1 | dyi+1 |
| ⋮ | ⋮ | ⋮ | ⋮ | ⋮ | ⋮ | ⋮ |
| axj | ayi | fj | Sxj | Syj | dxj | dyj |

FIG. 8.
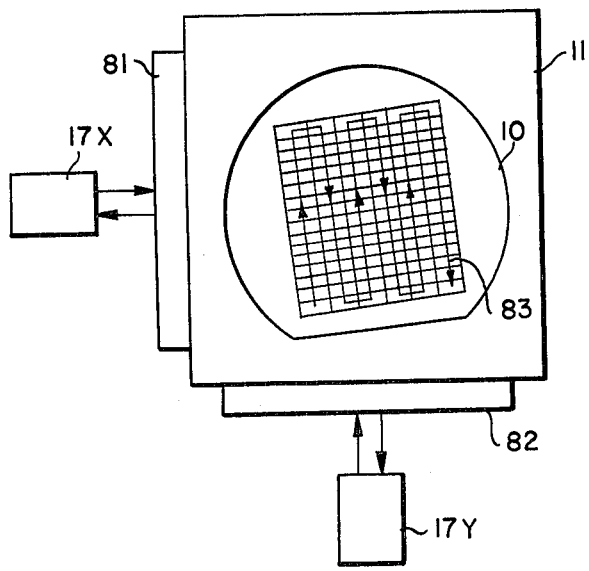
FIG. 9.
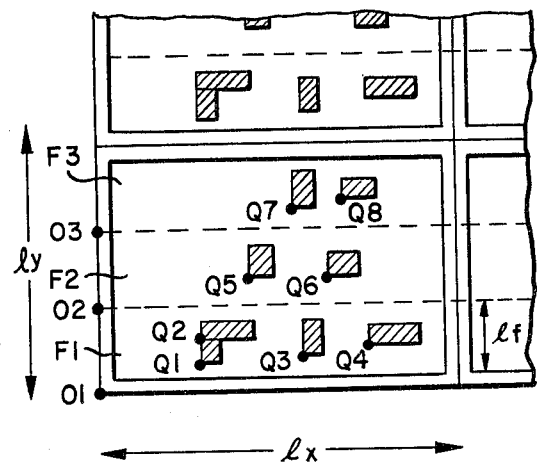
FIG. 10.
| FIELD NUMBER | POSITION | | SIZE | |
|---|---|---|---|---|
| | X | Y | X | Y |
| 01 (F1) | X1 | Y1 | $\ell 1$ | $\ell 1'$ |
| 01 (F1) | X2 | Y2 | $\ell 2$ | $\ell 2'$ |
| 01 (F1) | X3 | Y3 | $\ell 3$ | $\ell 3'$ |
| 01 (F1) | X4 | Y4 | $\ell 4$ | $\ell 4'$ |
| 10 (F2) | X5 | Y5 | $\ell 5$ | $\ell 5'$ |
| 10 (F2) | X6 | Y6 | $\ell 6$ | $\ell 6'$ |
| 11 (F3) | X7 | Y7 | $\ell 7$ | $\ell 7'$ |
| 11 (F3) | X8 | Y8 | $\ell 8$ | $\ell 8'$ |
FIG. 11A.
| FIELD NUMBER | POSITION OF O1 | |
|---|---|---|
| 01 | O1x | O1y |
FIG. 11B.
| FIELD NUMBER | POSITION OF O2 | |
|---|---|---|
| 10 | O2x | O2y |
FIG. 11C.
| FIELD NUMBER | POSITION OF O3 | |
|---|---|---|
| 11 | O3x | O3y |

ELECTRON BEAM EXPOSURE SYSTEM AND AN APPARATUS FOR CARRYING OUT THE SAME

BACKGROUND OF THE INVENTION

1. Field of the Invention

The present invention relates to an electron beam exposure system and an electron beam apparatus for exposing a medium by continuously moving a stage supporting said medium.

2. Description of the Prior Art

The electron beam exposure system is well known as a method for forming minute patterns of an LSI (Large Scale Integrated Circuit). This electron beam exposure system is classified into (1) the step and repeat system where patterns are depicted on the wafer by repeating a process that a wafer is exposed by, for example, a variable rectangular beam, then shifted by one step and then exposed by said beam by shifting the stage mounting said wafers step by step, and (2) the continuous stage moving system where patterns are depicted by projecting the beam to the wafers while said stage is always moved continuously.

In the former system, the electron beam deflection range is comparatively as wide as 2 (two) to 5 (five) mm square, and the stage moves 2 to 5 mm in a direction and stops to project the electron beam on a wafer and then moves 2 to 5 mm after the projection. The exposed portions are thus sequentially formed by repeating such operations. In the latter system, the stage moves continuously at a rate of about 20 mm/sec, a beam is scanned in the range as narrow as about 250 $\mu$m at the right angle to the moving direction of the wafer, and thereby patterns are depicted on the wafers.

The former step and repeat system has merit in that the beam position control is easy at the time of depicting patterns since the stage is in the stationary condition. However, this system also has demerit in that compensation for obscurity, such as distortion, field curvature, astigmatism, etc., is required since the deflection width of the electron beam is wide and movement of the stage lacks smoothness because it is moved step by step for every pattern depiction and always subjected to acceleration and deceleration. On the other hand, the latter continuous stage moving system has merit in that the stage moves smoothly and naturally on account of the continuous movement of the stage and the variety of compensations mentioned above are not required due to the narrow deflection of the electron beam. However, this system also has demerit in that the beam position control is complicated due to the continuous movement of the stage, a narrow deflection of electron beam provides less amount of exposing process, and thereby a longer period is required for depicting desired patterns.

SUMMARY OF THE INVENTION

It is an object of the present invention to provide a highly accurate and high speed electron beam exposing system having the merits of both the step and repeat system and continuous stage shifting system outlined above.

It is another object of the present invention to provide an apparatus for the high speed electron beam exposure.

According to the present invention, provided is an electron beam exposure system in which an electron beam is radiated to a medium mounted on a continuously moving stage characterized in that a correction memory for storing electron beam correction data for at least one of a field curvature, an astigmatism and a distortion which change in accordance with deflection amount of the electron beam, said deflection amount is obtained from a difference between a medium position data and a beam deflection position data from a processor, and said electron beam correction data corresponding to said deflection amount is read out from said correction memory and applied to a beam control means.

BRIEF DESCRIPTION OF THE DRAWINGS

FIGS. 6A, 6B, 6C, 6D explain the field curvature, astigmatism and distortion.

FIG. 7 explains the contents of a correction memory.

FIG. 8 shows the layout of the wafer, stage and laser interferometers.

FIG. 9 shows the exposed field and exposed pattern in a chip.

FIG. 10 explains the contents of a pattern memory.

FIGS. 11A, 11B, 11C explain the contents of a register.

DESCRIPTION OF THE PREFERRED EMBODIMENT

Figure 1:
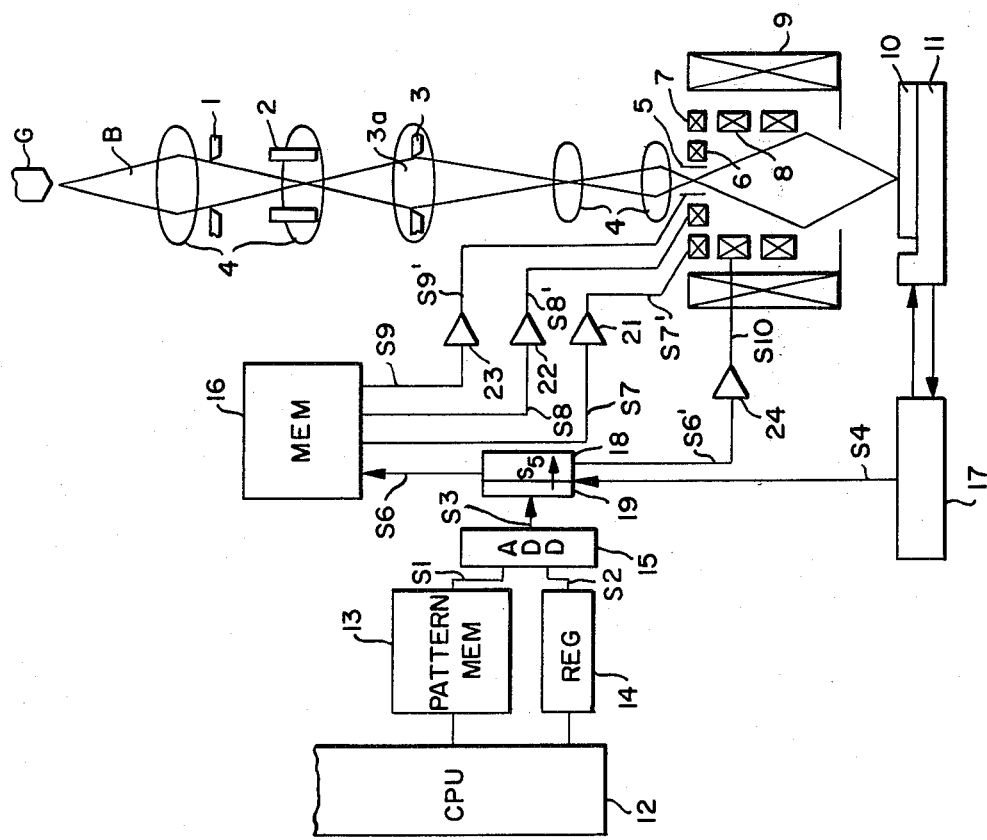
FIG. 1 shows the structure as a whole of an embodiment of the present invention.
Figure 3:
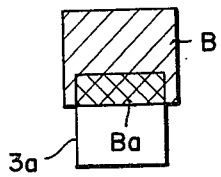
FIG. 3 explains the variable rectangular beam system.
Figure 4:
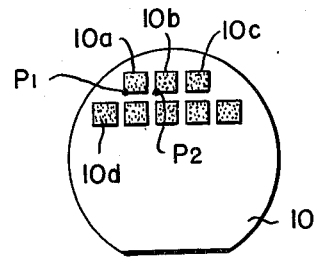
FIG. 4 shows chips of an wafer.
Figure 5:
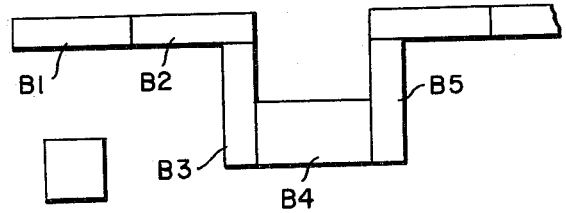
FIG. 5 explains a method of exposing the patterns in combination with the rectangular beams.

FIG. 1 and FIGS. 2(A-C) respectively show the embodiment of the electron beam exposure apparatus of the present invention. In these figures, G is an electron gun and B is the electron beam emitted from said electron gun. 1 is a first slit for the electron beam B. 2 is deflection plates for deflecting the electron beam section into a variable rectangular shape. 3 is a second slit. 4 is electron lenses for focusing and image forming. 5 is deflection plates for correcting distortion. 6 is a stigmator coil. 7 is a focus coil. 8 is a deflection coil. 9 is a convergence coil. 10 is a medium, such as a wafer, placed on a stage 11 which moves continously. The electron beam B emitted from the electron gun G is converged by the electron lens 4, whereby an image of the first slit 1 is formed on the second slit 3 and deflected by the deflection plate 2. Thus, for example, the portion Ba of the electron beam B, indicated by the mesh in FIG. 3, passes the aperture 3a of the second slit 3, is and shaped into the rectangular beam, and is projected to the desired position on the wafer 10 via the electron lens, convergence coil, deflection coil, etc. The semiconductor wafer 10 allows, as indicated in FIG. 4, formation of many integrated circuit chips 10a, 10b, ... (these are scribed into individual IC chips) and usually respective chips of the wafer 10 have the same patterns, namely the same internal element arrangement. The electron beam B is projected on these chips before being scribed and thus each pattern of the integrated circuit chip is depicted by the procedures indicated in FIG. 5, namely a desired pattern is depicted in units of individual rectangular patterns B1, B2, B3, . . . and by adequately combining them, namely the exposing process, the photoresist is performed. As best seen in FIG. 1, the exposing location on the wafer is shifted in the present invention by the movement of stage 11 and beam deflection by the deflection coil 8. 12 is a computer used for such control; 13 is a memory for storing pattern data of said integrated circuit chips; 14 is a register which stores a data of the field coordinates of chips on the wafer; 15 is an adder for adding a readout signal $S_1$ from the memory 13 and the field coordinate signal $S_2$ from register 14 and thereby outputs a combined signal $S_3$; 16 is a dynamic correction memory which stores correction data for correcting the field curvature, the astigmatism and the distortion of the electron beam. The field coordinate is represented by the specific points of the chips on the wafer, for example, by the coordinates of the points P1, P2 ... (FIG. 4). The signal $S_3$ obtained by adding the field coordinate signal $S_2$ and the output signal $S_1$ of the memory 13 indicates the coordinate of individual IC patterns on the wafer.

The stage 11 is driven in the X and Y directions by a motor not illustrated, and the locations of X and Y, more specifically, the locations of the field coordinates X, Y of the wafer on said stage are measured by a laser interferometer 17, as designated in FIG. 1. The wafer 10 is not always placed on the stage 11 in the determined condition and usually it is deviated or rotated by a certain angle to the X and Y directions from the determined condition. 18 is a primary converter consisting of a matrix circuit (which performs addition/subtraction and multiplication/division) in order to correct such positional deviation. For example, positions of three marks determining the plane of the wafer are detected by the electron beams, deviation from the determined position is detected by measuring such positions, an output of the laser interferometer 17 is corrected in accordance with such deviation and said output is set to the coordinates predetermined by the memory 13 and the register 14. 19 is a subtractor which outputs a difference signal $S_5$ obtained by subtracting the signal $S_4$ of the interferometer 17 from the signal $S_3$ of said adder 15. The signal $S_5$ of the subtractor 19 is added to the amplifier 24 via the primary converter 18 by output signal $S_6$. The amplifier 24 converts the digital signal $S_6$ to the analog signal $S_{10}$ and amplifies said signal in order to excite the deflection coil 8.

Here, said field curvature, astigmatism, and distortion will be explained by referring to FIG. 6. Investigated is the deflection of the pattern $P_0$ at the position $(x_0, y_0)$ to the positions $(x_1, y_1)$, $(x_2, y_2)$, $(x_3, y_3)$, $(x_4, y_4)$ as indicated in FIG. 6A.

Figure 6A:
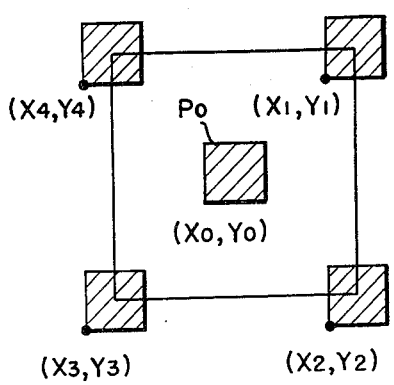
Figure 6B:
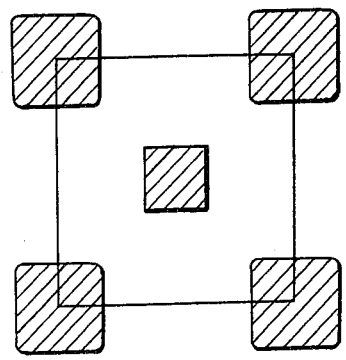

When the pattern $P_0$ exists at the position $(x_0, y_0)$, a correct pattern is depicted through correct focusing of the electron lens system, but when the electron beam is deviated, the focusing is also deviated and the pattern is obscured as indicated in FIG. 6B. This is called the field curvature.

However, in actuality, the pattern is not only obscured but also deformed as the electron beam is deflected as indicated in FIG. 6C. This is called the astigmatism.

Therefore, the correct pattern can be depicted as indicated in FIG. 6A by correcting astigmatism for the pattern of FIG. 6C to the pattern of FIG. 6B and by correcting the field curvature.

After the above-mentioned correction of the field curvature and astigmatism, in regard to the patterns $P_1$, $P_2$, $P_3$ and $P_4$ arranged at four corners of a square for the pattern $P_0$ at the position $(x_0, y_0)$ as indicated in FIG. 6D, it is supposed that the deflection information sent from the CPU and the actual deflection of the electron beam are adjusted, and the electron beam is deflected to the desired position.

In this case, the pattern is depicted at the correct position like the patterns $P_1$, $P_2$, $P_3$, $P_4$ on the diagonal of the square with the center $P_0$. However, if it is attempted, for example, to depict the pattern $P_0'$ of the position $(x_m, y_0)$, namely even when the information to deflect the pattern $P_0$ to the position $(x_m, y_0)$ is input to the deflection coil from the CPU, the electron beam is actually deflected to the position $(x_n, y_0)$ and the pattern $P_0''$ is depicted. Such deviation of the deflection position is called the distortion.

Figure 2A:
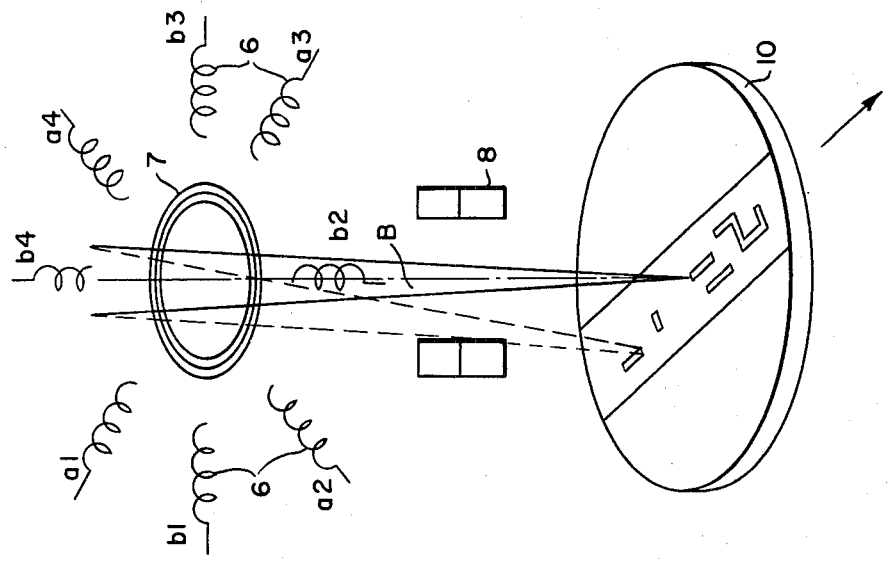
FIGS. 2A, 2B, 2C respectively show the focus coils and stigmator coils of an embodiment of the present invention.

The focus coil 7 used for correcting the above-mentioned field curvature is a ring-shape coil wound in such a way as to surround the electron beam B as indicated in FIG. 2A.

Figure 2B:
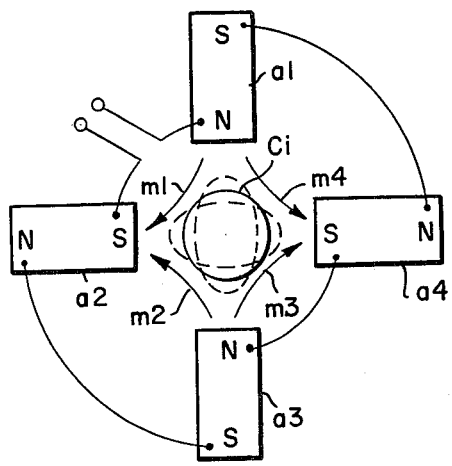
Figure 2C:
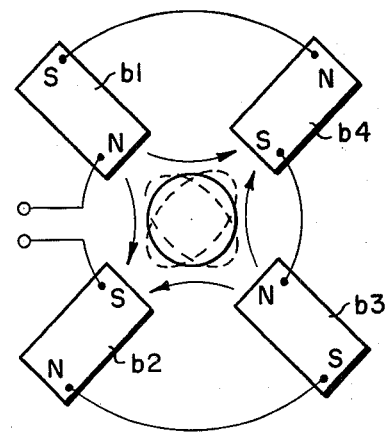

The stigmator coil 6 used for correcting astigmatism consists of eight (8) solenoid coils $a_1 \ldots, a_4$ and $b_1 \ldots, b_4$ which are arranged in the same plane with an interval of 45 degrees. FIGS. 2B and 2C show the solenoid coils in the form of blocks and also indicate mutual connections.

As is apparent from FIGS. 2A and 2B, the coils $a_1, \ldots, a_4$ have the same number of turns, but are connected in series so that the backward winding appears in every other coil. Therefore, when a current is applied to each coil via the winding, the pole N appears at the end surrounded by the coils in the case of coils $a_1$ and $a_3$, and the pole S similarly appears in the case of the coils $a_2$ and $a_4$. Thereby, as indicated in FIG. 2B, the magnetic lines of force $m_1, m_2, m_3, m_4$ appear.

Thus, for example, the circular beam Ci can be deformed vertically or horizontally as indicated by the dotted line by controlling a current flowing through the coils. It also suggests that the ellipse beam indicated by the dotted line can be shaped to the circular beam $C_i$.

The coils $b_1, \ldots, b_4$ indicated in FIG. 2C have the same structure as the coils $a_1, \ldots, b_4$ indicated in FIG. 2B, and these coils are arranged with displacement of only 45 degree intervals between the coils $a_1-a_3$.

Therefore, the electron beam can be shaped into a direction displaced only by 45 degrees from that in the FIGS. 2B. As will be obvious from the above explanation, the electron beam can be shaped freely by arranging the coils of FIGS. 2B and 2C through the combination as indicated in FIG. 2A.

Said distortion changes depending on the deflection angle, but is also influenced by the correction of the field curvature and the astigmatism. Therefore, distortion can be understood as the function of the beam deflection angle $\theta$ and said field curvature and astigmatism. At any rate, since these values are determined when a deflection angle $\theta$ is determined, correction data of said values for respective deflection angles are written into the memory 16. 21 to 23 are amplifiers for activating the deflection plates 5, stigmator coil 6, focus coil 7 through DA conversion of the output of memory 16.

FIG. 7 shows an example of the content of the memory 16. The one region to be exposed by the electron beam is divided into j sections in the direction X and i sections in the direction Y (i, j are integers).

Thereby, the region to be exposed can be considered as the minute regions divided having the addresses from $(ax_1, ay_1)$ to $(ax_j, ay_i)$.

Here, the correction amount of the field curvature at the address ($ax_1$, $ay_1$) is pre-obtained as $f_1$, the correction amount of the astigmatism in the direction X as $Sx_1$ and that in the direction Y as $Sy_1$, the correction amount of distortion in the direction X as $dx_1$ and that in the direction Y as $dy_1$. The correction amount corresponding to each address up to ($ax_j$, $ay_i$) is obtained prior to exposure in the same way, and moreover each correction amount is stored in the memory 16. This address corresponds to the deflection amount of the electron beam as will be explained later.

FIG. 8 shows the plan view of the wafer 10 placed on the stage 11.

Mirrors 81, 82 are respectively provided at the sides in the directions of X and Y of the stage 11, along with a laser interferometer 17X for detecting the position in the direction X of the stage 11 and a laser interferometer 17Y for detecting the position in the direction Y of the stage 11.

The stage 11 is continuously moved in the directions X and Y with a motor not illustrated, and thereby the region on the wafer 10 is sequentially and continuously exposed as a result of relative operations as indicated by the arrow 83. FIG. 9 shows an enlarged portion of the wafer 10. The chips in a size of $l_x \times l_y$ are arranged in the form of a matrix on the wafer 10 and each chip consists of three exposing fields $F_1$, $F_2$ and $F_3$, each field being a size of $l_x \times l_f$.

In general $l_x > l_f$ in the size of the exposing field and $l_f$ is as small as 1/5 to ½ of the deflection width of the electron beam. The size of $l_x$ is a little smaller than the deflection width of the electron beam.

In the exposing field $F_1$, patterns $Q_1$, $Q_2$, $Q_3$, $Q_4$ are to be exposed, while $Q_5$ and $Q_6$ are exposed in the field $F_2$, and $Q_7$ and $Q_8$ in the field $F_3$. The origins of the fields $F_1$, $F_2$ and $F_3$ are respectively indicated by $O_1$, $O_2$ and $O_3$.

In this case, the contents indicated in FIG. 10 is transferred to the pattern memory 13 from the CPU 12 and stored therein.

Namely, when the positional coordinate indicated in FIG. 9 by the dot of the pattern $Q_1$ in the field $F_1$ is ($x_1$, $y_1$), the length in the direction X of the pattern dimension is $l_1$ and the length in the direction Y is $l_1'$, and in the same way the positional coordinates and pattern dimensions are set up to pattern $Q_8$, these data are stored in the pattern memory 13 of FIG. 10.

In addition, the coordinate of origin of each field is transferred to the register 14 from the CPU 12 in accordance with the fields $F_1$, $F_2$, $F_3$ and stored therein.

Namely, in case the pattern in the field $F_1$ is to be exposed, the coordinates ($O_{1x}$, $O_{1y}$) of the orgin $O_1$ of the field $F_1$ indicated in FIG. 9 are stored in the register 14 as indicated in FIG. 11A.

In the same way, the coordinates of origins ($O_{2x}$, $O_{2y}$), ($O_{3x}$, $O_{3y}$) as indicated in FIG. 11B for the field $F_2$ or as indicated in FIG. 11C for the field $F_3$ are stored in the register 14.

For this reason, in case the pattern $Q_1$ in the field $F_1$ is to be exposed, the data $x_1$, $y_1$ and $l_1$ and $l_1'$ are read out from the pattern memory 13, while the data $O_{1x}$, $O_{1y}$ are obtained from the register 14. Then, this data is added in the adder 15. Thereby, the deflection amount from the origin of exposure by means of the electron beam can be obtained in case the stage is not moved.

Namely, the output signal $S_3$ in FIG. 1 indicates the coordinate of the pattern in the relevant chip (the chip specified by the field coordinate 14) viewed from the field coordinate of the wafer 10. On the other hand, the laser interferometer 17 provides the current position signal $S_4$ of the wafer 10. The signal $S_y$ is substracted from the signal $S_3$ by the subtractor 19, the difference output signal $S_5$ of the subtractor 19 is converted by the primary converter 18, and the output $S_6$ of the converter 18 indicates the amount of deflection of the electron beam. The deflection coil 8 is activated in accordance with such signal $S_6$ and therefore the beam is projected to the desired position in accordance with the data of the pattern coordinate. The stage moves but since the rectangular beam projection period is very short, the wafer is considered to be in the stationary condition during projection of the electron beam. The difference signal $S_6$ is also used for retrieval of memory 16, and the correction amount f, $S_x$, $S_y$, $d_x$, $d_y$ of the field curvature, astigmatism and distortion corresponding to the deflection amount of the electron beam are read out and then applied to the respective adjusting means 5, 6, 7 via the signals $S_7'$, $S_8'$, and $S_9'$, respectively, of amplifiers 21 to 23.

In case the pattern $Q_1$ is to be exposed, the deflection amounts $\overline{X}$, $\overline{Y}$ are obtained by the following equation.

$$\begin{pmatrix} \overline{X} \\ \overline{Y} \end{pmatrix} = \begin{pmatrix} a_{11} & a_{12} \\ a_{21} & a_{22} \end{pmatrix} \begin{pmatrix} x_1 + X_p - X(t) \\ y_1 + Y_p - Y(t) \end{pmatrix} + \begin{pmatrix} a_{13} \\ a_{23} \end{pmatrix}$$

Here, $a_{11}$, $a_{22}$ are gain; $a_{12}$, $a_{21}$ are rotation of the wafer; $a_{13}$, $a_{23}$ are off-set. ($x_1$, $y_1$) is the coordinate of the pattern $Q_1$ from the origin $O_1$, while ($X_p$, $Y_p$) is the coordinate of the origin $O_1$ and ($X(t)$, $Y(t)$) is the output of the laser interferometer, namely the positional coordinate of the stage. The above primary conversion is carried out by the primary converter 18 of FIG. 1.

The deflection amount $\overline{X}$, $\overline{Y}$ obtained thereby becomes the address $a_x$, $a_y$ in the correction memory 16 of FIG. 7 and the amount of corrections f, $S_x$, $S_y$, $d_x$, $d_y$ of the corresponding field curvature, astigmatism and distortion are read out with such address used as the index and then inputted to the correction means 5, 6 and 7.

As explained, in detail, the electron beam exposure system and the apparatus for the same has offered a variety of effects such as a high speed formation of pattern and accurate depiction of patterns since the stage is moved continuously and the rectangular electron beam is projected with deflection by a large deflection angle.

What is claimed is:

1. An electron beam exposure system in which a rectangular electron beam is radiated to a medium placed on a continuously moving stage comprising:
   a processor for providing a deflection data of said electron beam;
   means for providing a position data of said medium on said continuously moving stage;
   means for providing a beam deflection amount data in accordance with both of said deflection data and said position data;
   a correction memory for storing electron beam correction data for at least one of a field curvature, an astigmatism and a distortion corresponding to the deflection amount data of the electron beam; and
   control means for adjusting said electron beam in accordance with said electron beam correction data corresponding to said deflection amount data read out from said correction memory.

2. An electron beam exposure apparatus comprising:
exposing means including a continuously moveable stage, a mechanism for projecting a rectangular electron beam in a variable cross-section onto a medium placed on said continuously moving stage, a deflection coil for said electron beam and electron beam adjusting means for at least one of a field curvature, astigmatism and distortion,
means for outputting a current position signal of said continuously moving stage,
means for storing and processing position data of said medium positioned on said continuously moving stage and said electron beam deflection,
a subtractor for obtaining a difference between an output of said position data processing means and an output of said current position signal output means,
an amplifier which inputs an output of said subtractor and outputs a signal for activating said deflection coil, and
correction memory means for storing electron beam correction data for at least one of the field curvature, and astigmatism and the distortion corresponding to each deflection angle of the electron beam and activating said electron beam adjusting means in accordance with said electron beam correction data.

3. The electron beam exposure apparatus of claim 2, wherein said stage is continuously moved in an X and Y direction, and wherein said current position signal output means comprises an interferometer for detecting the position of said stage in the X and Y directions.

4. The electron beam exposure apparatus of claim 2 or 3, wherein said storing and processing means comprises a CPU, a memory for storing pattern data of said medium, and a register for storing certain coordinates of said medium.

5. The electron beam exposure apparatus of claim 4, wherein said medium comprises a wafer having a plurality of chips of a predetermined size and arranged in the form of a matrix on said wafer, each chip consisting of three exposing fields, and each field being of a predetermined size and having exposing patterns to be formed therein, and wherein the positional coordinates of the patterns, the length of the pattern dimension, and the coordinates of the exposing fields, are provided to said CPU.

6. The electron beam exposure apparatus of claim 5, wherein the positional coordinates and pattern dimensions of said patterns and each of said fields of said chips are stored in said pattern memory and the coordinates of each exposing field are stored in said register as inputted from said CPU.

7. The electron beam exposure apparatus of claim 6, wherein said storing and processing means further compises an adder for adding the data stored in said register and said pattern memory and having an output signal to said subtractor which represents the coordinates of the pattern in the relevant chip viewed from the field coordinate of the wafer.

8. The electron beam exposure apparatus of claim 7, wherein said subtractor obtains the difference between the signal from said adder and said current position signal output means.

9. The electron beam exposure apparatus of claim 8, wherein said signal is continuously moved in an X and Y direction, and wherein said current position signal output means comprises an interferometer for detecting the position of said stage in the X and Y directions.

10. The electron beam exposure apparatus of claim 2, wherein said amplifier outputs a signal for activating said deflection coil in accordance with the differential signal output of said subtractor and wherein the input to said correction memory means is the differential output signal of said subtractor.

11. The electron beam exposure apparatus of claim 9, wherein said amplifier outputs a signal for activating said deflection coil in accordance with the differential signal output of said subtractor and wherein the input to said correction memory means is the differential output signal of said subtractor.

12. The electron beam exposure apparatus of claim 2, wherein said electron beam adjusting means comprises a focus coil for ajusting field curvature, a stigmator coil adjusting astigmatism, and deflection plates for adjusting distortion for said electron beam in response to an output signal from said correction memory means.

13. The electron beam exposure apparatus of claim 12, further comprising amplifiers for converting from digital to analog the output signal of said correction memory means and for activating said focus coil, said stigmator coil, and said distortion deflecting plates.

14. The electron beam exposure apparatus of claim 12 or 13, wherein said focus coil comprises a ring-shaped coil surrounding said electron beam.

15. The electron beam exposure apparatus of claim 12 or 13, wherein said stigmator coil comprises a plurality of solenoid coils arranged in a common plane in intervals around said electron beam.

16. The electron beam exposure apparatus of claim 15, wherein said solenoid coils have the same number of turns and are connected in series for forming a current and with north and south alternating poles between said solenoid coils for shaping said electron beam.

17. The electron beam exposure apparatus of claim 15, wherein said solenoid coils comprise eight solenoid coils arranged around said electron beam at intervals of approximately 45°.

18. The electron beam exposure apparatus of claim 16, wherein said solenoid coils comprise eight solenoid coils arranged around said electron beam at intervals of approximately 45°.

19. The electron beam exposure apparatus of claim 8, wherein said electron beam adjusting means comprises a focus coil for adjusting field curvature, a stigmator coil for adjusting atigmatism, and deflection plates for adjusting distortion for said electron beam in response to an output signal from said correction memory means.

20. The electron beam exposure apparatus of claim 19, further comprising amplifiers for converting from digital to analog the output signal of said correction memory means and for activating said focus coil, said stigmator coil, and said distortion deflecting plates.

21. The electron beam exposure apparatus of claim 20, wherein said focus coil comprises a ring-shaped coil surrounding said electron beam.

22. The electron beam exposure apparatus of claim 19, wherein said stigmator coil comprises a plurality of solenoid coils arranged in a common plane in intervals around said electron beam.

23. The electron beam exposure apparatus of claim 2 or 12, wherein said exposing means provides a rectangular electron beam with deflection of a large deflection angle.

* * * * *

UNITED STATES PATENT AND TRADEMARK OFFICE
CERTIFICATE OF CORRECTION

PATENT NO. : 4,362,942

DATED : Dec. 7, 1982

INVENTOR(S) : Hiroshi Yasuda

It is certified that error appears in the above-identified patent and that said Letters Patent is hereby corrected as shown below:

Front page, insert:
--[30] Foreign Application Priority Data
    Dec. 10, 1979   Japan .... Tokugansho 54-159920--;

Front page [56], References Cited,
"Baldwin et al." should be --Baldwin, Jr. et al.--.

Column 1, line 33, "the" should be --a--.
Column 2, line 25, "distorition" should be --distortion--;
Column 2, line 55, delete "and" (first occurrence).
Column 6, line 3, "$S_y$" should be --$S_4$--.
Column 8, line 17, "ajusting" should be --adjusting--.

Signed and Sealed this

Twenty-seventh Day of September 1983

[SEAL]

Attest:

GERALD J. MOSSINGHOFF

Attesting Officer    Commissioner of Patents and Trademarks